United States Patent [19]
Misheloff et al.

[11] Patent Number: 5,903,468
[45] Date of Patent: May 11, 1999

[54] DETERMINING MAXIMUM LOAD INDEX FOR TABULAR TIMING MODELS

[75] Inventors: Michael N. Misheloff, Dublin; Sabita Jasty, San Jose, both of Calif.

[73] Assignee: VLSI Technology, Inc., San Jose, Calif.

[21] Appl. No.: 08/767,780

[22] Filed: Dec. 17, 1996

[51] Int. Cl.$^6$ .................................................. G06F 17/10
[52] U.S. Cl. ................................. 364/488; 395/500
[58] Field of Search .............................. 364/488; 395/500

[56] References Cited

U.S. PATENT DOCUMENTS

| 5,559,715 | 9/1996 | Misheloff . | |
|---|---|---|---|
| 5,625,803 | 4/1997 | McNelly et al. | 395/500 |

OTHER PUBLICATIONS

R.W. Phelps, *Advanced Library Characterization for High Performance ASIC, Proceedings of the IEEE International Asic Conference*, 1991, pp. P15–3.1 through P15–3.4.

A. Martinez, *Automated Library Characterization and Timing Model Accuracy Issues when Interfacing to Different CAD Tools*, presented at the WG 10.5 IFIP Workshop on Synthesis, Generation, and Portability of Library Blocks for ASIC Design, Grenoble, France, Mar. 12–13, 1992.

*Primary Examiner*—Kevin J. Teska
*Assistant Examiner*—Thuan Do
*Attorney, Agent, or Firm*—Douglas L. Weller

[57] ABSTRACT

In accordance with the preferred embodiment of the present invention, a logic cell library is built. Within the logic cell library a timing model for a first logic cell is generated. In order to generate the timing model a number of indices which specify input ramp for the first logic cell is selected. Also, a number of indices which specify output load for the first logic cell is selected. Also selected are a minimum value for the input ramp and a maximum value for the input ramp. A maximum output load for the timing model is calculated. This is done by calculating, for every input transition in the logic cell which causes an output transition, an intermediate value to be an output load value which results in the first logic cell producing an output signal to the first logic cell which has the maximum value for the input ramp when an input signal to the logic cell has the minimum value for the input ramp. The maximum output load is chosen to be a minimum of the calculated intermediate values.

18 Claims, 7 Drawing Sheets

DETERMINING MAXIMUM LOAD INDEX FOR TABULAR TIMING MODELS

BACKGROUND

The present invention concerns design and manufacturing of integrated circuits and pertains particularly to an accurate timing model for logic simulation of integrated circuits which utilizes tabular timing models.

When designing an integrated circuit, it is generally desirable to simulate the fimctioning of logic circuitry within the integrated circuit. In order to accurately access the performance of the circuitry, it is desirable that the logic simulation of logic include an accurate assessment of timing delays through the circuitry, at least in the critical paths.

In general, timing delays through circuitry are caused by propagation delays through and between logic cells which comprise the circuitry. The actual amount of propagation delay through and between logic cells is generally dependent on various capacitances within and between the logic cells, as well as the current available to charge or discharge the capacitances.

When developing a timing model, it is important, therefore, to take into account the time delay introduced by charging and discharging the input capacitance of logic cells. This time delay is directly affected by the input current available to charge or discharge the input capacitance to the logic cell. This input current, in turn, is directly affected by the fan out of the output of the logic cell providing the input current.

Timing models for logic circuits are often stored in a cell library used to design the logic circuit. The timing model is used in event driven simulation and synthesis of circuits constructed from the elements of the library. The timing model generally describes the cell delay between each input pin and output pin transition. There is often a separate timing model for each cell in the library.

For submicron circuits, an accurate cell delay model generally depends upon the ramp (or transition time) of the input pin for each cell in the library. The ramp is the time it takes for the voltage of the node to pass between two pre-specified values. Generally, the model also describes the ramp of the output pin. The output ramp model depends upon the load on the output pin. In addition, for some cells, the output ramp model also depends upon the input ramp.

In some commercial simulators and synthesizers the cell delay and output ramp models are stored in the form of tables. For example, this is done in a Design Compiler from Synopsis. In such a tabular cell delay model, the information is stored in a list of input ramp indices ($ir_1$, $ir_2$, $ir_3$, $ir_4$, . . ., $ir_m$), a list of output load indices ($c_1$, $c_2$, $c_3$, $c_4$, . . ., $c_n$) and an "m" by "n" array of cell delay values. For each input ramp index and each load index, there is listed an output ramp and a cell delay. This is done, for example, in a separate table each for the output ramp and the cell delay. Depending upon the implementation, the input ramp indices and the output load indices may or may not be shared by the table for the output ramp and the table for the cell delay. For cells where the output ramp does not depend upon the input ramp, the table for the output ramp is simplified so that for each load index there is listed an output ramp.

The particular values chosen for the indices may vary depending upon the cell used. Also, for a particular cell, the particular values chosen for the indices may vary depending upon the input pin/output pin combination which a particular table represents.

When a circuit is constructed from elements of the cell library and then simulated, the cell delays and output ramps for each cell instance are calculated from three criteria. The first criteria is the cell delay and output ramp models for the cell. This is essentially the tables described above. The second criteria is the load(s) on the output pin(s) of the cell instance. This is obtained from the capacitances of the output node wires and the input capacitances of subsequent cells driven by the output pin(s), This information is contained in the netlist of the circuit. The third criteria is the ramp(s) of the input pin(s) of the cell instance. These are equal to the output ramps of the cell instances driving the input pins of the cell instance.

When the timing models are stored in table format, the value of the cell delay and output ramp for a cell instance are obtained from interpolation (or extrapolation, if the input ramp and/or output load are outside the range of the indices) of the table values.

SUMMARY OF THE INVENTION

In accordance with the preferred embodiment of the present invention, a logic cell library is built. Within the logic cell library a timing model for a first logic cell is generated. In order to generate the timing model a number of indices which specify input ramp for the first logic cell is selected. Also, a number of indices which specify output load for the first logic cell is selected. Also selected are a minimum value for the input ramp and a maximum value for the input ramp. A maximum output load for the timing model is calculated. This is done by calculating, for every input transition in the logic cell which causes an output transition, an intermediate value to be an output load value which results in the first logic cell producing an output signal to the first logic cell which has the maximum value for the input ramp when an input signal to the logic cell has the minimum value for the input ramp.

The intermediate value is calculated, for example, by running a circuit simulation. Alternatively, the intermediate value is calculated using a parameterized expression. In any event, the maximum output load is chosen to be a minimum of the calculated intermediate values.

In the preferred embodiment, a table is constructed utilizing the indices which specify input ramp for the first logic cell, utilizing the indices which specify the output load for the first logic cell. The table entries indicate, for example, an output ramp for each pair of input ramp index and output load index. Alternatively, table entries indicate a logic cell delay for each pair of input ramp index and output load index. Each table entry is calculated by running a circuit simulation. Alternatively, each table entry is calculated using a parameterized expression.

The present invention provides an effective way to select a maximum output load when constructing a table within a cell library.

DESCRIPTION OF THE PREFERRED EMBODIMENT

Figure 1:
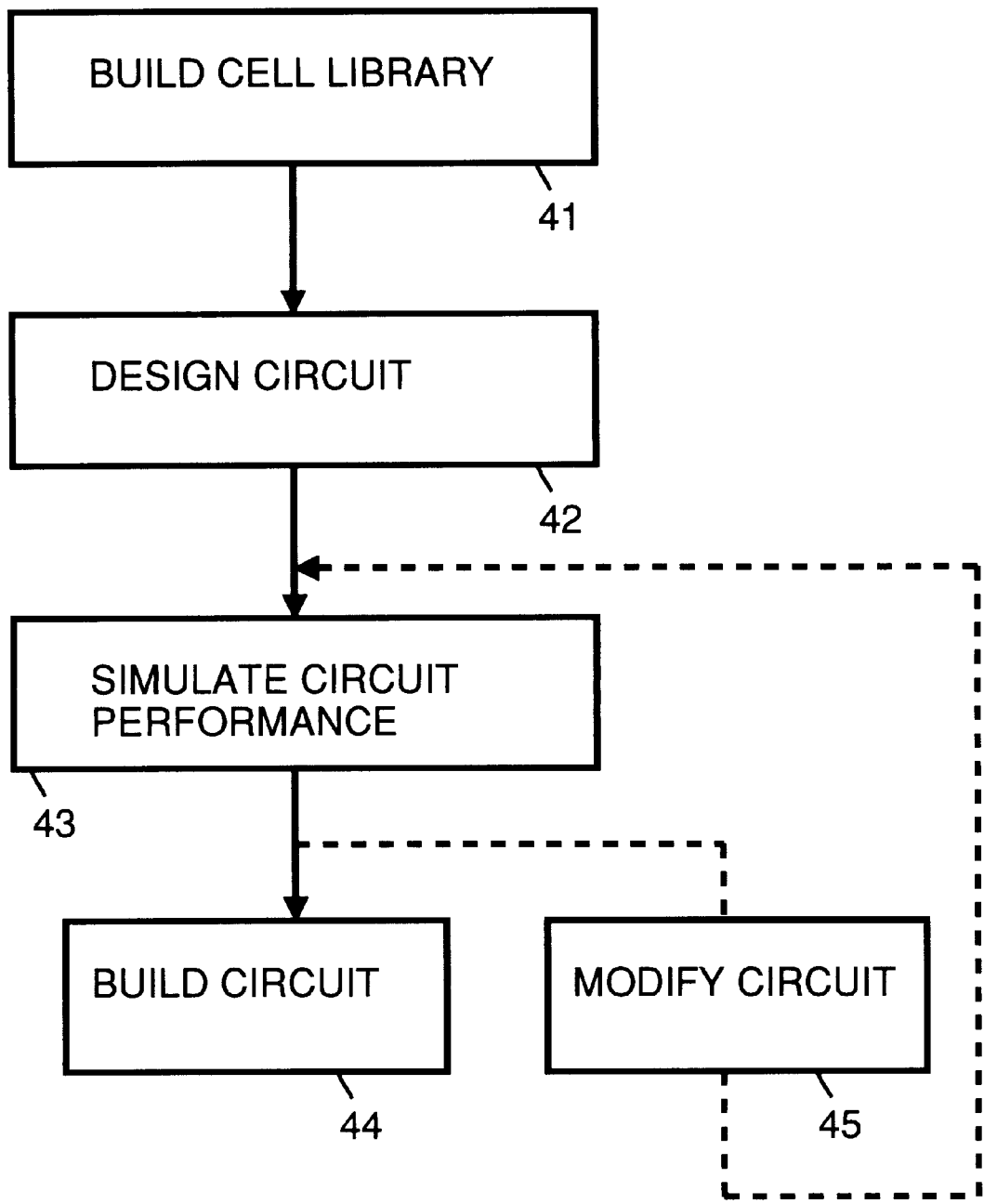
FIG. 1 sets out a simplified flowchart for designing and building an integrated circuit.

FIG. 1 sets out a simplified flowchart for designing and building an integrated circuit. In a step 41, a logic cell library is built. In a step 42, logic cells from the logic cell library are used to design the circuit. In a step 43, the circuit performance is simulated. In order to simulate performance of the circuit, performance information about each logic cell is obtained from the logic cell library. In order to improve performance, it may be necessary, in a step 45, to modify the circuit. When the performance is acceptable, in a step 44, the circuit is built.

Figure 2:
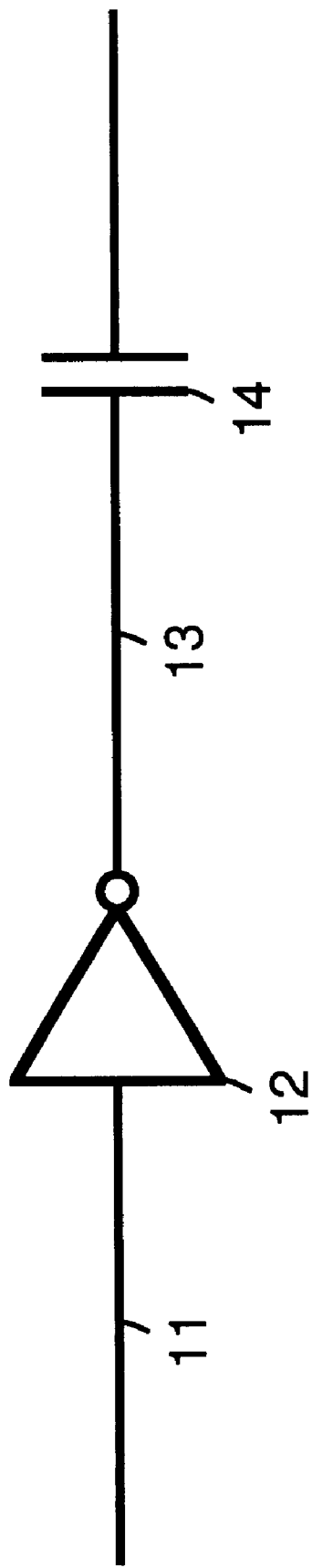
FIG. 2 shows a logic NOT gate for which a table within a cell library gives information.
Figure 3:
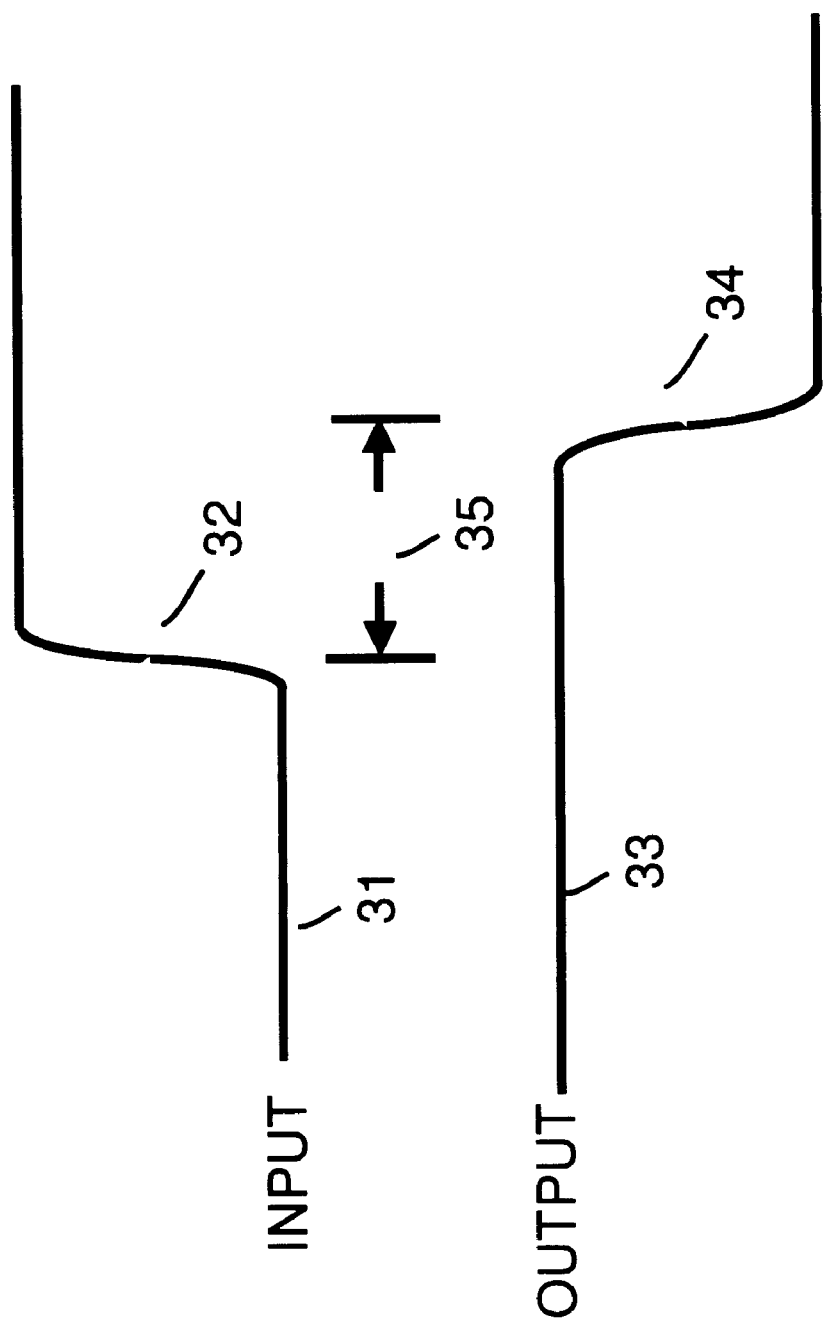
FIG. 3 shows an example of an input ramp and a resulting output ramp for the logic NOT gate shown in FIG. 2.
Figure 4:
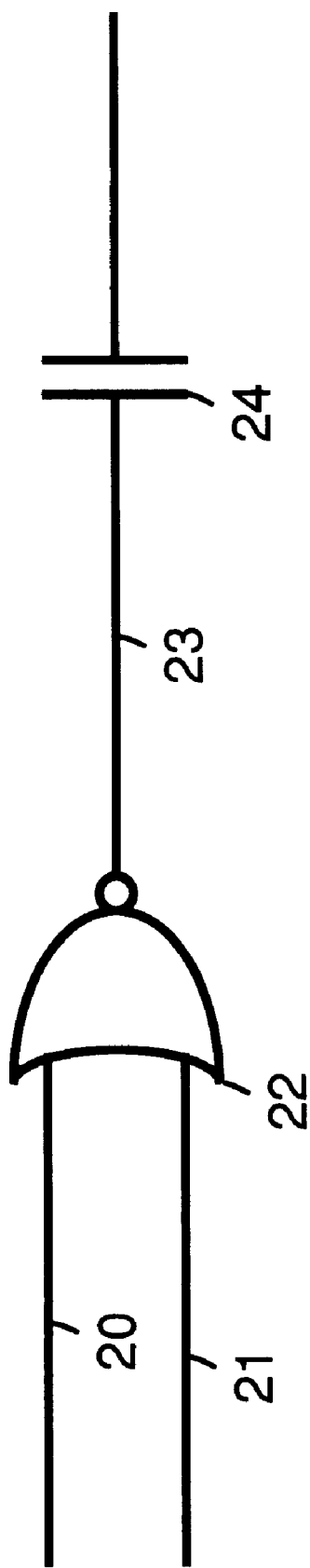
FIG. 4 shows a logic NOR gate for which a table within a cell library gives information.

The logic cell library stores information about logic cell performance. For example, for each logic cell, information about the output ramp and the logic cell delay is stored in a logic cell library. FIGS. 2, 3 and 4 illustrate what is meant by output ramp and logic cell delay.

FIG. 2 shows a logic NOT gate 12. A signal on an input 11 is inverted by logic NOT gate 12 to produce an inverted signal on an output 13. A capacitor 14 represents the capacitive load driven by logic NOT gate 12. The capacitive load driven by logic NOT gate 12 generally includes both the input capacitance of logic gates which utilize the inverted signal on output 13, as well as the capacitance of the wiring which connect these logic gates to logic NOT gate 12.

FIG. 3 shows an example of an input transition 32 and a resulting output transition 34 for logic NOT gate 12. An input signal 32 makes a transition from low (Vss) to high (Vdd). The input ramp is essentially the time it takes for the transition to occur. That is, when input signal 32 makes a transition from low (Vss) to high (Vdd), the input ramp is the time it takes for the transition to occur.

Output signal 33 makes a transition from high (Vdd) to low (Vss). The output ramp is essentially the time it takes for the transition to occur. That is, when output signal 34 makes a transition from high (Vdd) to low (Vss), the output ramp is the time it takes for the transition to occur.

A logic cell delay 35 is the delay in the occurrence between transition 32 of input signal 31 and corresponding transition 34 on output signal 33. This may be calculated in a number of ways. For example, logic cell delay 35 is the time difference between when the voltage on input signal 31 reaches ½ * (Vdd−Vss) and the time when the voltage on output signal 33 reaches ½ *(Vdd−Vss).

For logic NOT gate 12 shown in FIG. 2, there is only one input and one output. However, other logic gates may have plural inputs or outputs. For example, a logic NOR gate 22 shown in FIG. 4 has an input 20 and an input 21. Both a signal on input 20 and a signal on input 21 are used by logic NOR gate 22 to produce an output signal on an output 23. A capacitor 24 represents the capacitive load driven by logic NOR gate 22. The capacitive load driven by logic NOR gate 22 generally includes both the input capacitance of logic gates which utilize the output signal on output 23, as well as the capacitance of the wiring which connect these logic gates to logic NOR gate 22.

When placing performance information in a logic cell library, one methodology is to place this information in tables. There may be more than one table stored for each logic cell. A logic cell, for example, implements a logic gate such as a logic NOT gate 12 (shown in FIG. 2) or logic NOR gate 22 (shown in FIG. 4). For example, if a logic cell has more than one input and one output, a different table (or set of tables) is stored for each input/output pair. Also, generally there are separate tables for the output ramp and the logic cell delay. Depending upon the implementation, the input ramp indices and the output load indices may or may not be shared by the table for the output ramp and the table for the cell delay.

In such a tabular logic cell delay model, the information is stored in a list of input ramp indices ($i_r$, $ir_2$, $ir_3$, $ir_4$, ..., $ir_m$), a list of output load indices ($c_1$, $c_2$, $c_3$, $c_4$, ..., $c_n$) and an "m" by "n" array of logic cell delay values. For each input ramp index and each load index, there is listed an output ramp and/or a logic cell delay. When the timing model is used during circuit performance simulation (e.g., in step 43 shown in FIG. 1), the value of the logic cell delay and output ramp for a logic cell instance are obtained from interpolation (or extrapolation, if the input ramp and/or output load are outside the range of the indices) of the table values.

Figure 5:
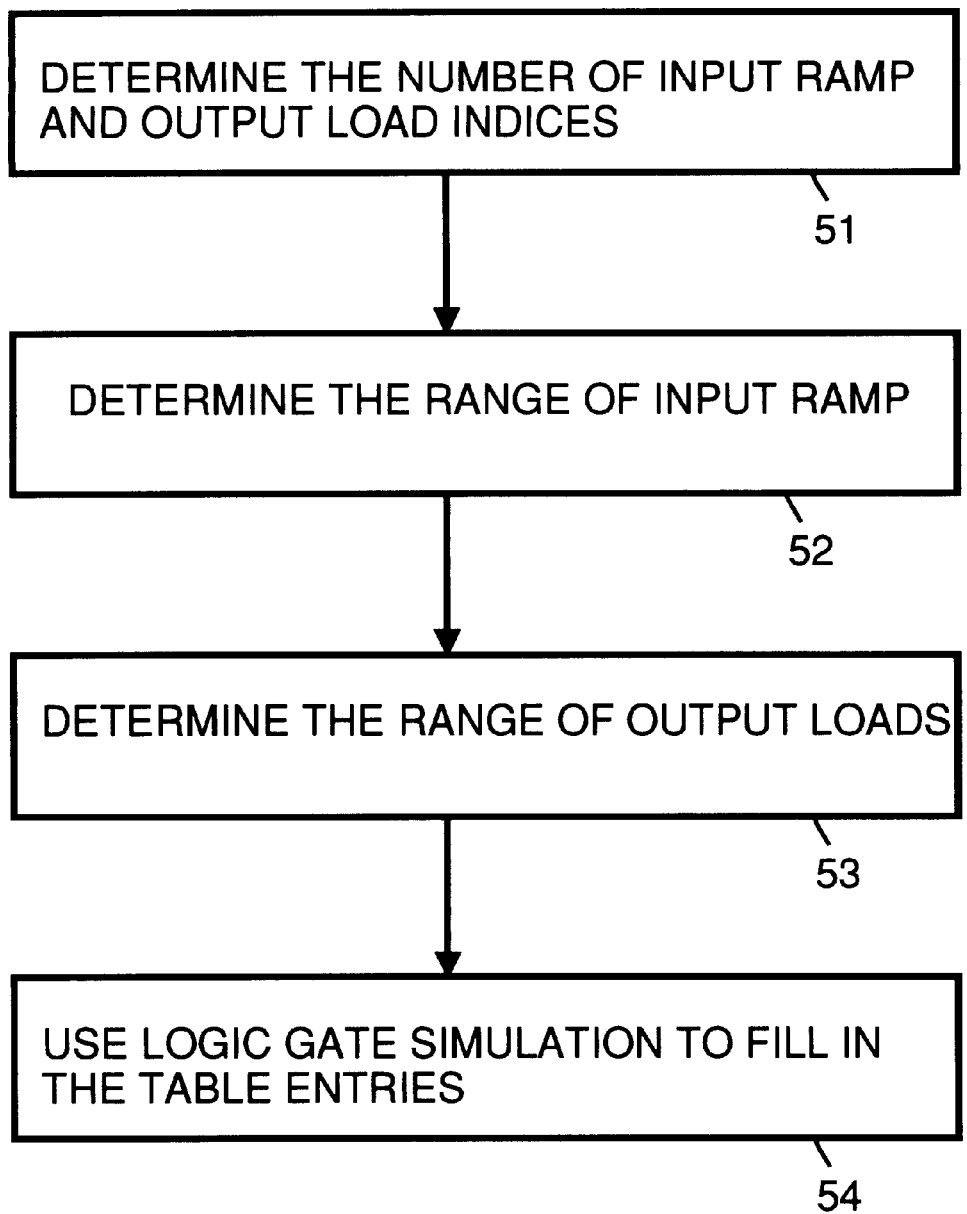
FIG. 5 sets out a simplified flowchart for building a table used within a cell library in accordance with a preferred embodiment of the present invention.

FIG. 5 shows a simplified flowchart for building a table used within a logic cell library. In a step 51, a determination is made as to how many input ramp indices and output load indices are to be used for the table. The number of input ramp and output load indices is limited by the efficiency of the system. Not only does increasing the number of indices increase the effort required for characterization, but it also increases the CPU time needed for simulation. In fact, these last considerations typically limit the number of input ramp indices and the number of output load indices such that their product is less than approximately 25.

In a step 52, the range of values for the input ramp is determined. Usually a single range of ramp input values is chosen for all the tables in the library. The minimum value ($ir_{min}$) is zero or a very small value. The maximum value ($ir_{max}$) is the maximum value of internal ramps allowed in circuits which are constructed with the logic cells (elements) of the library. The constraint of limiting the internal ramps is implemented in design flows by having the circuit synthesizer automatically modify a circuit for which the maximum ramp is exceeded; alternatively, circuit simulators warn the circuit designer when a violation of the maximum input ramp occurs.

In a step 53, the range of values for the output loads is determined. Different ranges are usually chosen for each library logic cell. The minimum value ($c_{min}$) is zero or a very small value. For each logic cell, the library designer must specify the maximum value, ($c_{max}$). In the prior art, this is done by an educated guess. The methodology for determining the maximum value, ($c_{max}$) for the output load in the preferred embodiment of the present invention will be described below.

In principle, arbitrary accuracy (with respect to circuit simulation) is achieved provided that the ranges of input ramp and output load indices are large enough to include all instances of interest, and the number of input ramp and output load indices is large enough so that the spacing between indices is small enough. In practice, as described above, the number of input ramp and output load indices is limited by the efficiency of the system.

A scheme for distributing the input ramp indices between $ir_{min}$ and $ir_{max}$, and a scheme for distributing the output load indices between $c_{min}$ and $c_{max}$ must also be specified. Usually this is done so that the index points are equally spaced.

Equation 1 below sets out a formula for generating the input ramp indices where m is the number of input ramp indices.

$$ir_j = ir_{min} + (j-1)*(ir_{max} - ir_{min})/(m-1) \quad (j=1,2,\ldots m) \qquad \text{Equation 1}$$

Equation 2 below sets out a formula for generating the output load indices where n is the number of output load indices.

$$c_k = c_{min} + (k-1)*(c_{max} - c_{min})/(n-1) \quad (k=1,2,\ldots n) \qquad \text{Equation 2}$$

In a step 54, logic gate simulation is used to fill in the table entries. Using logic gate simulation to fill in the table entries is often referred to as characterization. There are two common methods of characterization which may be employed: "brute force" characterization, and "indirect" characterization.

"Brute force" characterization is accomplished by performing a circuit simulation of the logic cell for each table entry. That is, for each input ramp and output load combination, the logic cell is simulated and a value is determined for placement into the table. For an example of brute force characterization, see A. Martinez, *Automated Library Characterization and Timing Model Accuracy Issues when Interfacing to Different CAD Tools*, presented at the WG 10.5 IFIP Workshop on Synthesis, Generation, and Portability of Library Blocks for ASIC Design, Grenoble, France, Mar. 12–13, 1992.

"Indirect" characterization is accomplished by using an intermediate step between the circuit simulation and the determination of the individual values in the table. In particular, explicit parameterized expressions for logic cell delay and output ramp are used in this approach. The parameters for each logic cell are determined by fitting the parameters to the results of a set of circuit simulations. The table values are determined by evaluating the intermediate expressions with the input ramp and the output load specified by the index values. For an example of indirect characterization, see U.S. Pat. No. 5,559,715 issued to Michael N. Misheloff for *Timing Model and Characterization System for Logic Simulation of Integrated Circuits Which Takes into Account Process, Temperature and Power Supply Variations*; R. W. Phelps, *Advanced Library Characterization for High Performance ASIC*, Proceedings of the IEEE International Asic Conference, 1991, pp. P15–3.1 through P15–3.4.

Figure 6:
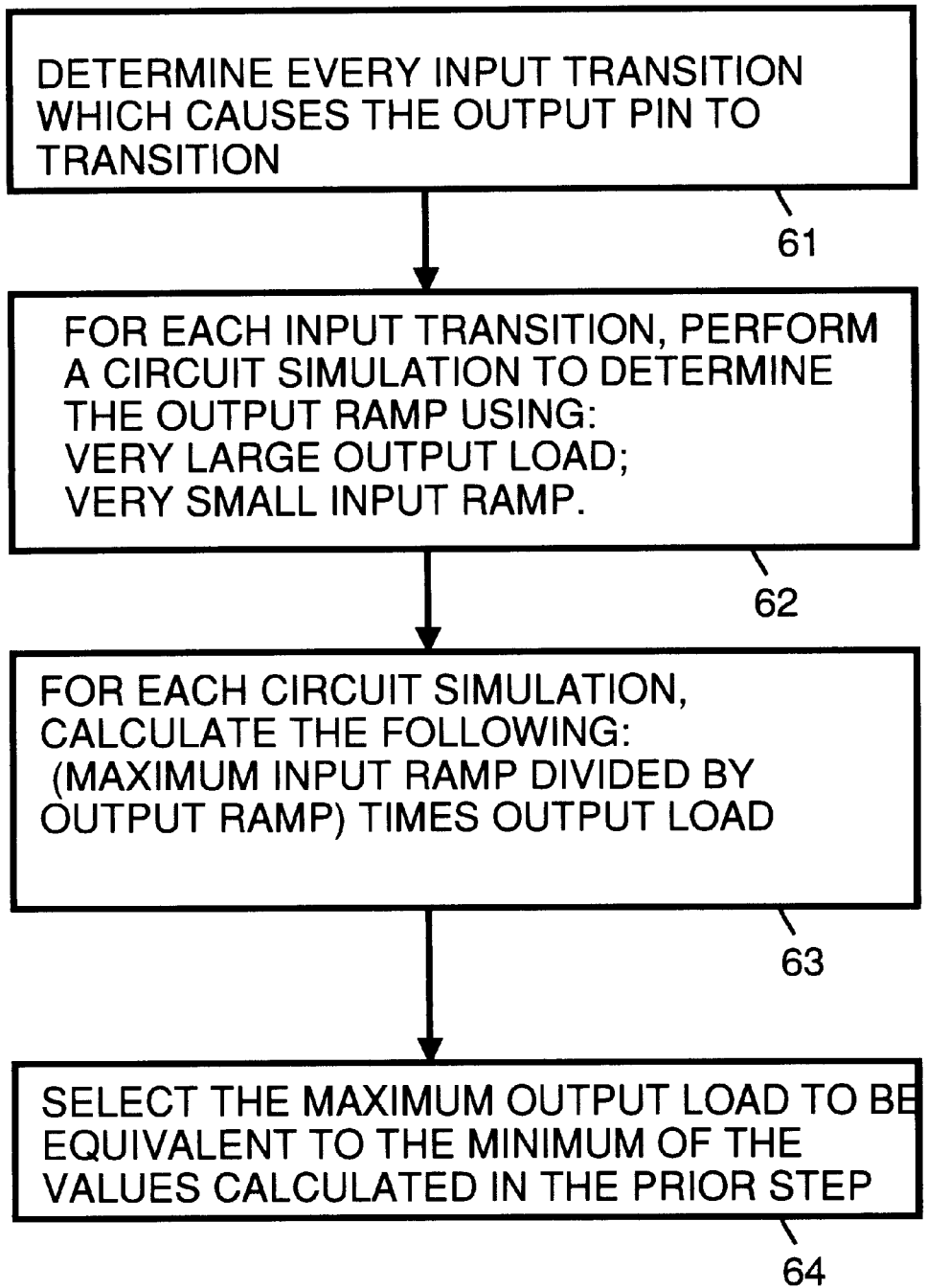
FIG. 6 sets out a simplified flowchart for determining a maximum output load used in a table within a cell library in accordance with a preferred embodiment of the present invention.
Figure 7:
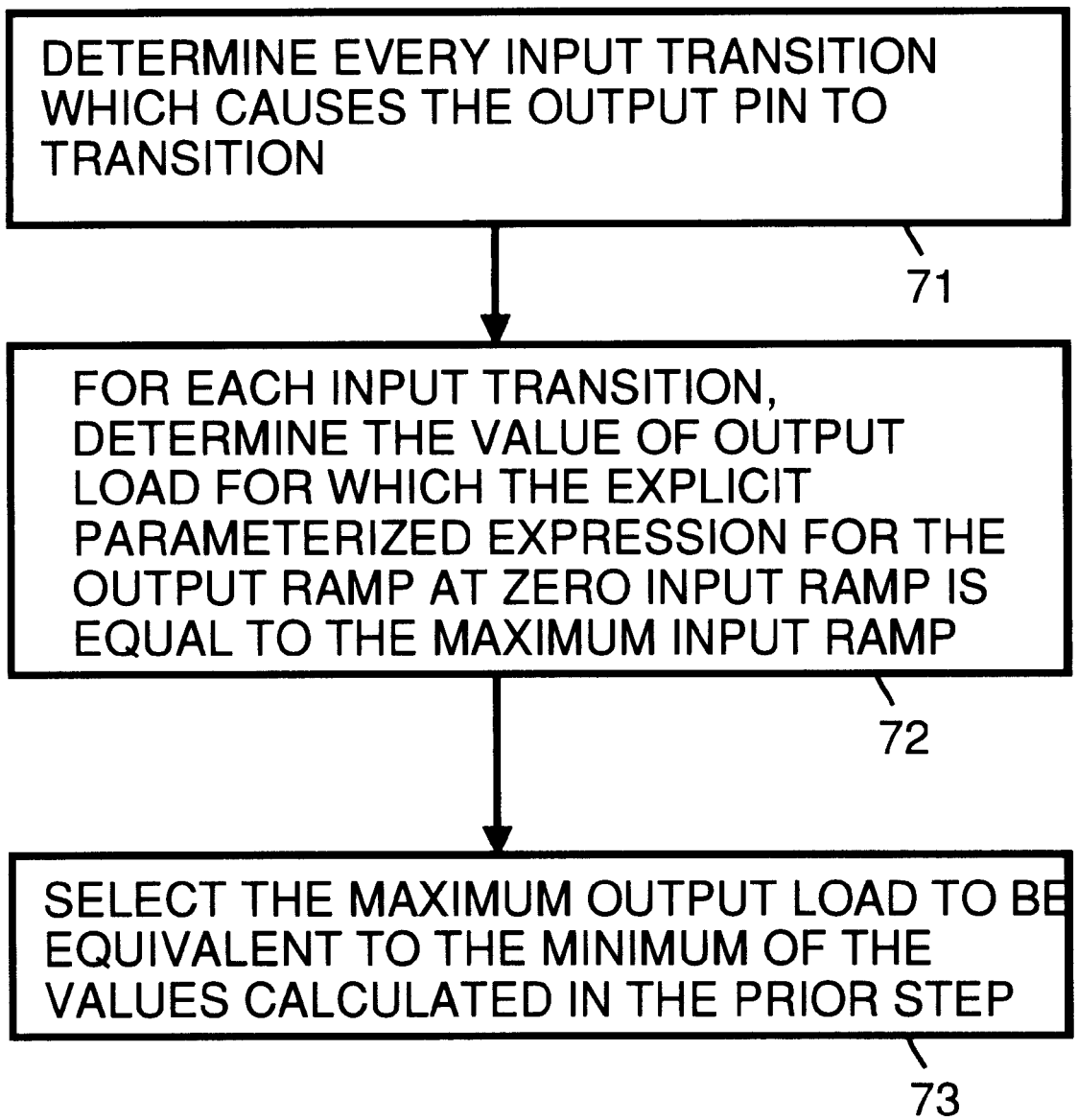
FIG. 7 sets out a simplified flowchart for determining a maximum output load used in a table within a cell library in accordance with an alternative preferred embodiment of the present invention.

FIG. 6 and FIG. 7 provide alternate methods for determining the maximum output load ($c_{max}$) to be used in a table. FIG. 6 sets out a method which is used when the brute force method of characterization is used. FIG. 7 sets out a method which is used when indirect characterization is used.

In general, it is desirable to choose the maximum output load large enough so that the range between $c_{min}$ and $c_{max}$ will cover all output capacitances of the logic cell in all circuits manufactured using the library. The reason for this is to avoid extrapolation from the table values. On the other hand, it is desirable to choose the maximum output load as small as possible so as to minimize the spacing between output load indices.

In the various embodiments of the present invention, the value of $ir_{max}$ is used to determine the value of $c_{max}$. The restriction of internal ramp values to being less than $ir_{max}$ effectively limits the output loads on all instances of a logic cell to be less than a particular (logic cell and pin dependent) value. For each logic cell and output pin, $c_{max}$ is determined to be approximately this limit.

In general, for any output pin and for a fixed load, the output ramp is at a minimum when the input ramp is zero.

Also, for any output pin, for zero input ramp and large enough output load (Cout) the output ramp (OR) is very well approximated by equation 3 below where A is a very small positive constant and B is a positive constant.

$$OR = A + B*C_{out} \qquad \text{Equation 3}$$

FIG. 6 sets out a simplified flowchart for determining a maximum output load when brute force characterization is used. In a step 61, every input pin transition which causes the output pin to transition is determined.

In a step 62, for every input pin transition which causes the output pin to transition as determined in step 61, a circuit simulation is performed with a very large output load (Cout) and a very small input ramp. The output load is large enough so that the output ramp is much larger than the maximum input ramp ($IR_{max}$). For each of these simulations the output ramp (OR) is determined.

In a step 63, for each circuit simulation performed in step 62, the maximum input ramp is divided by the output ramp and the result is multiplied by the output load (($ir_{max}$/OR) *Cout).

In a step 64, the maximum output load is selected be the minimum of the values calculated in step 63.

FIG. 7 sets out a simplified flowchart for determining a maximum output load when brute force characterization is used. In a step 71, every input pin transition which causes the output pin to transition is determined.

In a step 72, for every input pin transition which causes the output pin to transition as determined in step 71, an indirect characterization is performed to determine that value of output load for which the explicit parameterized expression for the output ramp at zero input ramp is equal to the maximum input ramp ($OR_{(at\ IR=0)} = IR_{max}$). As discussed above, indirect characterization is accomplished by using an intermediate step between the circuit simulation and the determination of the individual values in the table. In particular, explicit parameterized expressions for logic cell delay and output ramp are used in this approach. The parameters for each logic cell are determined by fitting the parameters to the results of a set of circuit simulations. The output ramp is determined by evaluating the intermediate expressions with the input ramp and the output load specified.

In a step 73, the maximum output load is selected be the minimum of the values calculated in step 72.

What follows is an example which illustrates performance of the present invention in the generation of a table for an inverter drawn at 0.35 micron design rules. The power supply voltage is Vdd=3.3 volts. Ground voltage is Vss=0 volts.

The input ramp is specified as input to a SPICE simulation as explained below. For input rising, voltage ($V_{input}$) on the input node of the inverter rises linearly from Vss to Vdd in accordance with equation 4 below.

Vinput=0 for Time<$T_{start}$

Vinput=Vdd*(Time−Tstart)/Input Ramp for $T_{start}$<Time<$T_{start}$+ Input Ramp Vinput=Vdd for $T_{start}$+Input Ramp<Time  Equation 4

In equation 4 and equation 5 below, "Time" is the current time, "Tstart" is the time at which the input ramp begins to rise, and "Input Ramp" is the input ramp.

For input falling, voltage ($V_{input}$) on the input node of the inverter falls linearly from Vdd to Vss in accordance with equation 5 below:

Vinput=Vdd for Time<Tstart

Vinput=Vdd−Vdd*(Time−Tstart)/Input Ramp for
    $T_{start}$<Time<$T_{start}$+Input Ramp Vinput=0 for $T_{start}$+Input Ramp<Time             Equation 5

For the current example, the logic cell delay is defined to be the difference between the time when the voltage of output node passes through Vdd/2 and the time when the voltage of the input node passes through Vdd/2.

The output waveform is approximated by a straight line which is drawn through points where the output voltages passes through 35% of Vdd (~1.155 volts) and 65% of Vdd (~2.145 volts). The output ramp is the time interval for this straight line approximation to pass between Vss and Vdd (for rising output) or between Vdd and Vss (for falling output). Equation 6 below summarizes this method of calculating the output ramp, where T(35% Vdd) is the time at which the output passes through 35% of Vdd and T(65% Vdd) is the time at which the output passes through 65% of Vdd.

Output Ramp=Absolute Value [T(65% Vdd)−
    T(35% Vdd)]/0.3                          equation 6

For the example, the number of input ramp indices is chosen to be 5 and the number of output load indices is chosen to be 5 (see step 51 of FIG. 5). The range of the input ram is chosen to be approximately 2 nanoseconds (see step 52 of FIG. 5). Both the input ramp indices and the output ramp indices will be linearly spaced between the minimum and maximum values.

When using the brute force characterization method, the method set out in FIG. 6 is used to calculate the maximum load (step 53 of FIG. 5). In the brute force characterization, the minimum input ramp is chosen to be 0.001 nanoseconds (nS) rather than 0 nanoseconds because a SPICE simulation cannot be performed with a perfectly sharp input. Thus the input ramp indices will be 0.001 nS, 0.5 nS, 1.0 nS, 1.5 nS and 2.0 nS.

In step 61, shown in FIG. 6, there are two input transitions which causes the output to transition. When the input rises from Vss to Vdd, this causes the output to fall from Vdd to Vss. When the input falls from Vdd to Vss, this causes the output to rise from Vss to Vdd.

In step 62, for the first input transition, a SPICE simulation is run with the output load ($C_{out}$) equal to 10 pF and an input ramp equal to 0.00nS. The input rises from Vss (time=0) to Vdd (time=0.001 nS). From the SPICE simulation, it is determined that the output ramp is at 65% Vdd (2.145 V) at time T(65% Vdd) equals 8.526 nanoseconds. The output ramp is at 35% Vdd (1.155 V) at time T(35% Vdd) equals 16.293 nanoseconds. The output ramp is therefore equal to (16.293−8.526)/0.3=25.890 nanoseconds.

For the second input transition, a SPICE simulation is run with the output load ($C_{out}$) equal to 10 pF and an input ramp equal to 0.001 nS. The input falls from Vdd (time=0 nS) to Vs (time=0.001 nS). From the SPICE simulation, it is determined that the output ramp is at 35% Vdd (1.155 V) at time T(35% Vdd) equals 12.416 nanoseconds. The output ramp is at 65% Vdd (2.145 V) at time T(65% Vdd) equals 25.059 nanoseconds. The output ramp is therefore equal to (25.059−12.416)/.3=42.143 nanoseconds.

In step 63, for each circuit simulation performed in step 62, the maximum input ramp is divided by the output ramp and the result is multiplied by the output load (($ir_{max}$/OR)*Cout). For the first simulation, the value is equal to (2 nS/25.890 nS)*10 pF=0.7725 pF. For the second simulation the value is equal to (2 nS/42.143 nS)*10 pF=0.475 pF.

In step 64, the maximum output load is selected be the minimum of the values calculated in step 63. This is 0.475 pF.

The output load indices are linearly spaced between the minimum output load and the maximum output load to produce the following output load indices: 0, 0.11875 pF, 0.2375 pF, 0.35625 pF, 0.475 pF. The same list of input ramp and output load indices will be used for both output rising and output falling delays and output ramp tables.

In step 54 (shown in FIG. 5), logic gate simulation is used to fill in the table entries. To fill in the table, SPICE simulations are run with the input ramp and output load set at each pair of the indices. Table 1 below shows the result for Logic cell Delay (Table 1 entries are in nanoseconds).

TABLE 1

| Output Load (pF) | Input Ramp (nS) = | | | | |
|---|---|---|---|---|---|
| | 0.001 | 0.500 | 1.000 | 1.500 | 2.000 |
| .00000 | 0.021 | 0.089 | 0.142 | 0.191 | 0.238 |
| .11875 | 0.243 | 0.339 | 0.436 | 0.540 | 0.626 |
| .23750 | 0.460 | 0.552 | 0.657 | 0.767 | 0.872 |
| .35625 | 0.676 | 0.767 | 0.868 | 0.974 | 1.085 |
| .47500 | 0.893 | 0.983 | 1.082 | 1.185 | 1.292 |

Table 2 below shows the result for the Output Ramp (Table 2 entries are in nanoseconds).

TABLE 2

| Output Load (pF) | Input Ramp (nS) = | | | | |
|---|---|---|---|---|---|
| | 0.001 | 0.500 | 1.000 | 1.500 | 2.000 |
| .00000 | 0.037 | 0.084 | 0.127 | 0.164 | 0.198 |
| .11875 | 0.538 | 0.538 | 0.594 | 0.679 | 0.751 |
| .23750 | 1.038 | 1.038 | 1.038 | 1.074 | 1.155 |
| .35625 | 1.538 | 1.538 | 1.538 | 1.538 | 1.565 |
| .47500 | 2.038 | 2.038 | 2.038 | 2.038 | 2.038 |

When using the indirect characterization method, the method set out in FIG. 7 is used to calculate the maximum load (step 53 of FIG. 5). In the indirect characterization, the minimum input ramp is chosen to be 0 nanoseconds (nS). Thus the input ramp indices will be 0 nS, 0.5 nS, 1.0 nS, 1.5 nS and 2.0 nS.

In step 71 shown in FIG. 7, there are two input transitions which causes the output to transition. When the input rises from Vss to Vdd, this causes the output to fall from Vdd to Vss. When the input falls from Vdd to Vss, this causes the output to rise from Vss to Vdd.

In step 72, for each input transition, an indirect characterization is performed to determine that value of output load for which the explicit parameterized expression for the output ramp at zero input ramp is equal to the maximum input ramp ($OR_{(at\ IR=0)}=IR_{max}$).

For example, the explicit formulas used have six parameters: $A_0$, $A_1$, $B$, $D_0$, $D_1$, and $Z$. The two basic quantities used, $DT_0$ and $DT_1$ are given by equation 7 below:

$DT0 = A_0+D_0*$(Output Load)+$B*$Minimum(Input Ramp, $CIR$)+
    $Z*$Maximum(0,Input Ramp−$CIR$)

$DT1=A_0+D1*$(Output Load)+$B*$(Input Ramp)          Equation 7

The critical input ramp, CIR, is expressed in terms of the parameters and the output load as in equation 8 below:

$CIR=0.5*[A_0+A_1+(D_0+D_1)*$(Output Load)]/(1−$B$)    Equation 8

The delay and output ramp are expressed in terms of DT0 and DT1, as set out in equation 9 below:

$$\text{Delay} = 0.5*(DT_0 + DT_1 - \text{Input Ramp})$$

$$\text{Output Ramp} = DT_1 - DT_0 \qquad \text{Equation 9}$$

For a further explanation of indirect characterization, see for example, U.S. Pat. No. 5,559,714 issued to Michael N. Misheloff for Timing Model and Characterization System for Logic Simulation of Integrated Circuits Which Takes into Account Process, Temperature and Power Supply Variations.

For the inverter, the parameters have been characterized, for example, to be the values set out in Table 3 below.

TABLE 3

|   | Output Rising | Output Falling |
|---|---|---|
| $A_0$ | .0046 | .0077 |
| $A_1$ | .0428 | .0297 |
| B | .6895 | .6272 |
| $D_0$ | −.2342 | −.0544 |
| $D_1$ | 3.9763 | 2.5324 |
| Z | .5499 | .3873 |

For an input ramp equal to zero, the formula for determining the output ramp may be simplified to the formula set out in equation 10 below:

$$\text{Output Ramp} = (A_1 - A_0) + (D_1 - D_0)*\text{Output Load} \qquad \text{Equation 10}$$

For the rising input transition, the indirect characterization is performed to determine that value of output load for which the explicit parameterized expression for the output ramp at zero input ramp is equal to the maximum input ramp ($OR_{(at\ IR=0)} = IR_{max}$). Since $IR_{max}$ (and thus Output Ramp in equation 10) is equal to two, for the rising input transition, the output load is calculated as follows:

2=(0.0428−0.0046)+(3.9763+0.2342)*Output load Output load= 0.466 pF

For the falling input transition, the indirect characterization is performed to determine that value of output load for which the explicit parameterized expression for the output ramp at zero input ramp is equal to the maximum input ramp ($OR_{(at\ IR=0)} = IR_{max}$). Since $IR_{max}$ (and thus Output Ramp in equation 10) is equal to two, for the falling input transition, the output load is calculated as follows:

2=(0.0297−0.0077)+(2.5324+0.0544)*Output load Output load= 0.765 pF

In step 73, the maximum output load is selected be the minimum of the values calculated in step 72. This is 0.466 pF.

The output load indices are linearly spaced between the minimum output load and the maximum output load to produce the following output load indices: 0, 0.1165 pF, 0.2330 pF, 0.3495 pF, 0.4660 pF. The same list of input ramp and output load indices will be used for both output rising and output falling delays and output ramp tables.

To fill in the table entries, the above-described formulas are calculated with the input ramp and output load set at each pair of the indices. Table 4 below shows the result for Logic cell Delay (Table 4 entries are in nanoseconds).

TABLE 4

| Output Load (pF) | Input Ramp (nS) = | | | | |
|---|---|---|---|---|---|
|  | 0.000 | 0.500 | 1.000 | 1.500 | 2.000 |
| .0000 | 0.024 | 0.089 | 0.149 | 0.209 | 0.268 |
| .1165 | 0.242 | 0.336 | 0.416 | 0.476 | 0.535 |
| .2330 | 0.460 | 0.554 | 0.649 | 0.743 | 0.802 |
| .3495 | 0.678 | 0.772 | 0.867 | 0.962 | 1.057 |
| .4660 | 0.896 | 0.990 | 1.085 | 1.180 | 1.275 |

Table 5 below shows the result for the Output Ramp (Table 5 entries are in nanoseconds).

TABLE 5

| Output Load (pF) | Input Ramp (nS) = | | | | |
|---|---|---|---|---|---|
|  | 0.000 | 0.500 | 1.000 | 1.500 | 2.000 |
| .0000 | 0.038 | 0.097 | 0.167 | 0.237 | 0.307 |
| .1165 | 0.529 | 0.529 | 0.560 | 0.629 | 0.699 |
| .2330 | 1.019 | 1.019 | 1.019 | 1.022 | 1.092 |
| .3495 | 1.510 | 1.510 | 1.510 | 1.510 | 1.510 |
| .4660 | 2.000 | 2.000 | 2.000 | 2.000 | 2.000 |

The foregoing discussion discloses and describes merely exemplary methods and embodiments of the present invention. As will be understood by those familiar with the art, the invention may be embodied in other specific forms without departing from the spirit or essential characteristics thereof. For example, the present invention may be implemented by a computer. Accordingly, the disclosure of the present invention is intended to be illustrative, but not limiting, of the scope of the invention, which is set forth in the following claims.

We claim:

1. A method for building a logic cell library, comprising the following step:
    (a) generating a timing model for a first logic cell comprising the following substeps:
        (a.1) selecting how many indices which specify input ramp for the first logic cell will be used in the timing model;
        (a.2) selecting how many indices which specify output load for the first logic cell will be used in the timing model;
        (a.3) selecting a minimum value for the input ramp and a maximum value for the input ramp; and
        (a.4) calculating a maximum output load for the timing model, including the following substeps:
            (a.4.1) for every input transition in the logic cell which causes an output transition, calculating an intermediate value to be an output load value which results in the first logic cell producing an output signal to the first logic cell which has the maximum value for the input ramp when an input signal to the logic cell has the minimum value for the input ramp, and
            (a.4.2) choosing the maximum output load to be a minimum of the intermediate values calculated in substep (a.4.1).

2. A method as in claim 1 wherein step (a) additionally comprises the following substep:
    (a.5) constructing a table utilizing the indices which specify input ramp for the first logic cell, the indices which specify the output load for the first logic cell and table entries which indicate an output ramp for each pair of input ramp index and output load index.

3. A method as in claim 2 wherein in substep (a.5) each table entry is calculated by running a circuit simulation.

4. A method as in claim 2 wherein in substep (a.5) each table entry is calculated using a parameterized expression.

5. A method as in claim 1 wherein step (a) additionally comprises the following substep:
   (a.5) constructing a table utilizing the indices which specify input ramp for the first logic cell, the indices which specify the output load for the first logic cell and table entries which indicate a logic cell delay for each pair of input ramp index and output load index.

6. A method as in claim 5 wherein in substep (a.5) each table entry is calculated by running a circuit simulation.

7. A method as in claim 5 wherein in substep (a.5) each table entry is calculated using a parameterized expression.

8. A method as in claim 1 wherein in substep (a.4.1) the intermediate value is calculated by running a circuit simulation.

9. A method as in claim 1 wherein in substep (a.4.1) the intermediate value is calculated using a parameterized expression.

10. A method for building an integrated circuit comprising the following steps:
   (a) generating a logic cell library, comprising the following substep:
   (a.1) generating a timing model for a first logic cell comprising the following substeps:
      (a.1.1) selecting how many indices which specify input ramp for the first logic cell will be used in the timing model;
      (a.1.2) selecting how many indices which specify output load for the first logic cell will be used in the timing model;
      (a.1.3) selecting a minimum value for the input ramp and a maximum value for the input ramp; and
      (a.1.4) calculating a maximum output load for the timing model, including the following substeps:
         (a.1.4.1) for every input transition in the logic cell which causes an output transition, calculating an intermediate value to be an output load value which results in the first logic cell producing an output signal to the first logic cell which has the maximum value for the input ramp when an input signal to the logic cell has the minimum value for the input ramp, and
         (a.1.4.2) choosing the maximum output load to be a minimum of the intermediate values calculated in substep (a.4.1); and, (b) designing the integrated circuit using the logic cell library.

11. A method as in claim 10 wherein in substep (a.1) additionally comprises the following substep:
   (a.1.5) constructing a table utilizing the indices which specify input ramp for the first logic cell, the indices which specify the output load for the first logic cell and table entries which indicate an output ramp for each pair of input ramp index and output load index.

12. A method as in claim 11 wherein in substep (a.1.5) each table entry is calculated by running a circuit simulation.

13. A method as in claim 11 wherein in substep (a.1.5) each table entry is calculated using a parameterized expression.

14. A method as in claim 10 wherein step (a) additionally comprises the following substep:
   (a.1.5) constructing a table utilizing the indices which specify input ramp for the first logic cell, the indices which specify the output load for the first logic cell and table entries which indicate a logic cell delay for each pair of input ramp index and output load index.

15. A method as in claim 14 wherein in substep (a.1.5) each table entry is calculated by running a circuit simulation.

16. A method as in claim 14 wherein in substep (a. 1.5) each table entry is calculated using a parameterized expression.

17. A method as in claim 10 wherein in substep (a.1.4.1) the intermediate value is calculated by running a circuit simulation.

18. A method as in claim 10 wherein in substep (a.1.4.1) the intermediate value is calculated using a parameterized expression.

* * * * *